United States Patent
Choi et al.

(10) Patent No.: US 10,204,970 B2
(45) Date of Patent: Feb. 12, 2019

(54) ORGANIC LIGHT EMITTING DISPLAY DEVICE

(71) Applicant: SAMSUNG DISPLAY CO., LTD., Yongin, Gyeonggi-Do (KR)

(72) Inventors: Min-Hoon Choi, Yongin (KR); In-Sun Hwang, Yongin (KR); Sang-Il Park, Yongin (KR); Jeoung-Sub Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 30 days.

(21) Appl. No.: 14/543,758

(22) Filed: Nov. 17, 2014

(65) Prior Publication Data
US 2015/0137101 A1    May 21, 2015

(30) Foreign Application Priority Data

Nov. 18, 2013  (KR) .................. 10-2013-0139926

(51) Int. Cl.
*H01L 27/32* (2006.01)
*H01L 51/52* (2006.01)

(52) U.S. Cl.
CPC ...... *H01L 27/3258* (2013.01); *H01L 51/5209* (2013.01); *H01L 51/5225* (2013.01); *H01L 51/5262* (2013.01); *H01L 51/5271* (2013.01)

(58) Field of Classification Search
None
See application file for complete search history.

(56) References Cited

U.S. PATENT DOCUMENTS

| | | | | |
|---|---|---|---|---|
| 8,519,385 | B2* | 8/2013 | Lim | H01L 51/5209 |
| | | | | 257/40 |
| 2005/0127820 | A1* | 6/2005 | Yamazaki | H01L 51/5281 |
| | | | | 313/501 |
| 2006/0097631 | A1* | 5/2006 | Lee | H01L 51/5203 |
| | | | | 313/504 |
| 2008/0024402 | A1* | 1/2008 | Nishikawa | H01L 51/5209 |
| | | | | 345/82 |
| 2013/0021567 | A1 | 1/2013 | Gu et al. | |

(Continued)

FOREIGN PATENT DOCUMENTS

| | | |
|---|---|---|
| JP | 2008-235605 | 10/2008 |
| JP | 2010-062067 | 3/2010 |
| KR | 10-0477104 | 3/2005 |

OTHER PUBLICATIONS

Korean Patent Abstracts Publication No. 10-2003-0087335 A, dated Nov. 14, 2003, for KR 10-0477104, 1 page.

*Primary Examiner* — Fernando L Toledo
*Assistant Examiner* — Valerie N Newton
(74) *Attorney, Agent, or Firm* — Lewis Roca Rothgerber Christie LLP

(57) ABSTRACT

An organic light emitting display device includes a scan line, a data line, a power supply line, and a pixel. The scan line extends in one direction. The data line crosses the scan line. The power supply line crosses the scan line and the data line. The pixel is electrically coupled to the scan line, the data line, and the power supply line. The pixel includes an organic light emitting diode including a first electrode on a substrate, an organic layer on the first electrode, and a second electrode on the organic layer. The pixel further includes at least two domains configured to radiate light in directions different from each other.

7 Claims, 9 Drawing Sheets

(56) References Cited

U.S. PATENT DOCUMENTS

2014/0077725 A1* 3/2014 Lee ..................... H05B 37/02
  315/312
2015/0048335 A1* 2/2015 Chung ............... H01L 27/3267
  257/40

* cited by examiner

ORGANIC LIGHT EMITTING DISPLAY DEVICE

CROSS-REFERENCE TO RELATED APPLICATION

This application claims priority to and the benefit of Korean Patent Application No. 10-2013-0139926, filed on Nov. 18, 2013 in the Korean Intellectual Property Office, the entire content of which is incorporated herein by reference in its entirety.

BACKGROUND

1. Field

Aspects of embodiments of the present invention are directed toward an organic light emitting display device.

2. Description of the Related Art

In general, an organic light emitting display device has a structure in which an organic layer is disposed on an anode electrode having a portion exposed by a pixel defining layer, and a cathode electrode is disposed on the organic layer. In the organic light emitting display device, holes and electrons are injected into the organic layer from the anode and cathode electrodes, respectively, and the injected holes and electrons are recombined with each other in the organic layer, thereby forming excitons. The excitons emit energy in the form of light generated when they fall from an excited state to a ground state.

In the organic light emitting display device, the emission efficiency in the organic layer is relatively low, and thus, the light extraction efficiency of the organic light emitting display device may be improved by using (utilizing) an internal resonant structure. However, the optical path for each wavelength may be changed at the front of the internal resonant structure. Therefore, in the organic light emitting display device, display characteristics, such as white angle dependency (WAD), according to a viewer's viewing angle may be reduced, and side visibility of the display device may be reduced or deteriorated.

SUMMARY

Aspects of embodiments of the present invention are directed toward an organic light emitting display device having an improved display quality.

According to an embodiment of the present invention, an organic light emitting display device includes: a scan line; a data line crossing the scan line; a power supply line crossing the scan line and the data line; and a pixel electrically coupled to the scan line, the data line, and the power supply line, wherein the pixel includes an organic light emitting diode including a first electrode on a substrate, an organic layer on the first electrode, and a second electrode on the organic layer, and wherein the pixel further includes at least two domains configured to radiate light in directions different from each other.

The at least two domains of the pixel may include a first domain configured to radiate light in a first direction, and a second domain configured to radiate light in a second direction different from the first direction.

The first and second directions may be symmetric to each other about a boundary between the first and second domains.

The upper surfaces of the organic layer at the respective first and second domains may be opposite to each other and may be inclined downward. The organic layer at the respective first and second domains may have an inclination angle in a range of about 0 to about 90 degrees with respect to a flat surface of the substrate. The organic layer at the respective first and second domains may have an inclination angle in a range of about 0 to about 45 degrees with respect to the surface of the substrate.

The upper surfaces of the organic layer at the respective first and second domains may be opposite to each other and may be inclined upward.

According to another embodiment of the present invention, an organic light emitting display device includes: a base substrate including a transmission area and a non-transmission area, the transmission area for allowing light to be transmitted therethrough and including at least two domains, the non-transmission area for blocking light; a thin film transistor on the base substrate at the non-transmission area; and an organic light emitting diode on the base substrate at the transmission area, the organic light emitting diode being coupled to the thin film transistor, wherein the organic light emitting diode includes: a first electrode coupled to the thin film transistor; an organic layer on the first electrode; and a second electrode on the organic layer, and wherein the organic layer at a domain of the at least two domains is configured to radiate light in direction different than the organic layer at another domain of the at least two domains.

The at least two domains of transmission area may include a first domain configured to radiate light in a first direction, and a second domain configured to radiate light in a second direction different from the first direction. The upper surfaces of the organic layer at the respective first and second domains may be opposite to each other and may be inclined downward. An inclination angle of the organic layer at the respective first and second domains may be in a range of about 0 to about 90 degrees. The inclination angle may be in a range of about 0 to about 45 degrees.

The first and second directions may be symmetric to each other about a the boundary between the first and second domains.

The organic light emitting display device may further include a light shielding pattern on the second electrode at a boundary between the first and second domains.

The organic layers at the respective first and second domains may be spaced from each other at a boundary of the first and second domains. The organic light emitting display device may further include an insulating pattern at the boundary of the first and second domains and between the organic layer at the first domain and the organic layer at the second domain.

The at least two domains of the transmission area may include a first domain configured to radiate light in a first direction, and a second domain configured to radiate light in a second direction different from the first direction. The upper surfaces of the organic layer at the respective first and second domains may be opposite to each other and may be inclined upward.

The at least two domains of the transmission area may include a plurality of first domains configured to radiate light in a first direction and a plurality of second domains configured to radiate light in a second direction different from the first direction, wherein ones of the plurality of first domains and ones of the plurality of second domains may be alternately arranged. Upper surfaces of the organic layer at adjacent first and second domains may be opposite to each other and may be inclined upward. An inclination angle of the organic layer at the first domains and the second domains may be in a range of about 0 to about 90 degrees. The inclination angle of the organic layer may be in a range of about 0 to about 45 degrees.

The at least two domains of the transmission area may include a plurality of first domains, a plurality of second domains, and a plurality of third domains, ones of the plurality of first domains and ones of the plurality of second domains may be alternately arranged, and ones of the plurality of third domains may be between the ones of the plurality of first domains and ones of the plurality of second domains. An inclination angle of the organic layer at the respective plurality of first domains and plurality of second domains may be in a range of about 0 to about 90 degrees with respect to a flat surface of the base substrate. The inclination angle may be in a range of about 0 to about 45 degrees. An inclination angle of the organic layer at the plurality of third domains may be 0 degree with respect to the flat surface of the base substrate.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the disclosure to those skilled in the art.

In the figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
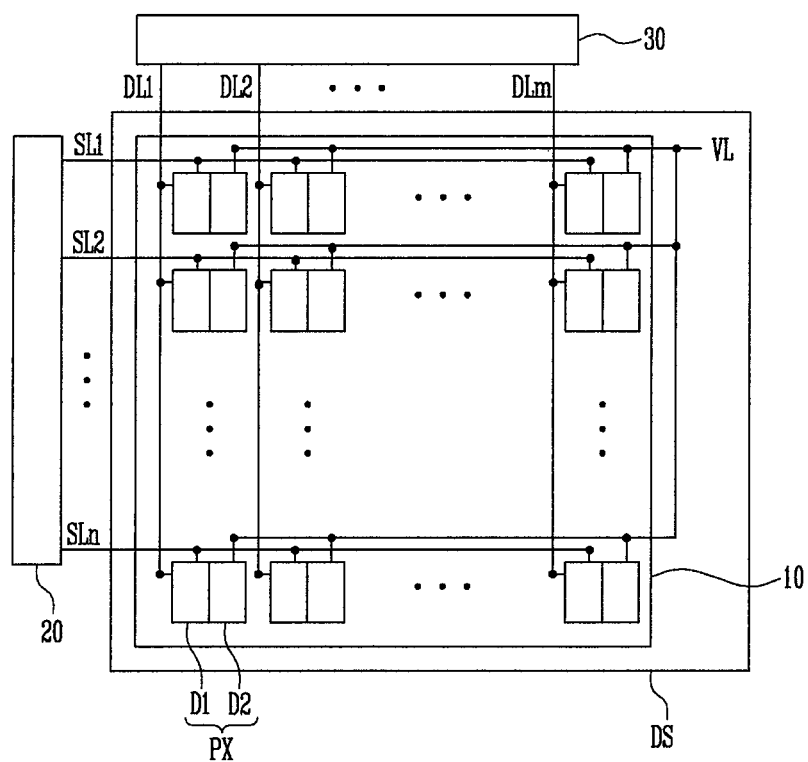
FIG. 1 is a conceptual circuit diagram illustrating an organic light emitting display device according to an embodiment of the present invention.

In the following detailed description, only certain example embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive.

It will be understood that when an element or layer is referred to as being "on," "connected to", or "coupled to" another element or layer, it can be directly on, connected, or coupled to the other element or layer, or one or more intervening elements or layers may also be present. When an element is referred to as being "directly on," "directly connected to", or "directly coupled to" another element or layer, there are no intervening elements or layers present. Like numerals refer to like elements throughout. As used herein, the term "and/or" includes any and all combinations of one or more of the associated listed items. Further, the use of "may" when describing embodiments of the present invention relates to "one or more embodiments of the present invention".

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein interpreted accordingly.

The terminology used herein is for the purpose of describing particular example embodiments only and is not intended to be limiting of example embodiments. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Figure 2:
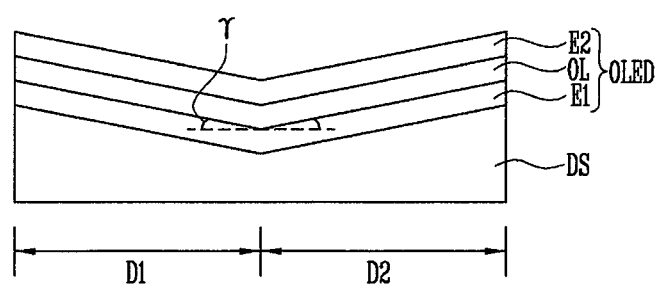
FIG. 2 is a sectional view illustrating a pixel shown in FIG. 1.
Figure 3:
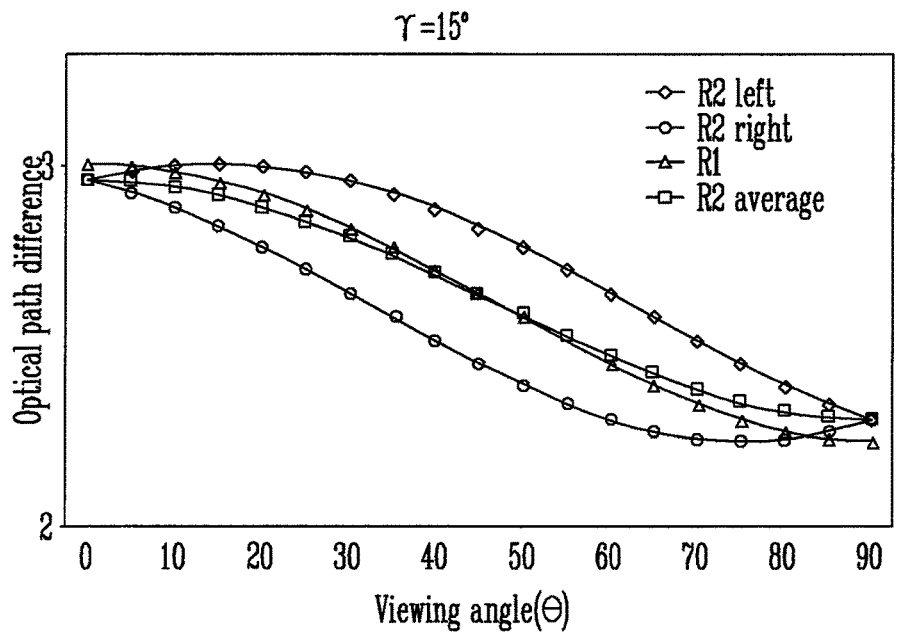
FIGS. 3 to 6 are graphs illustrating optical path differences with respect to viewing angles.
Figure 4:
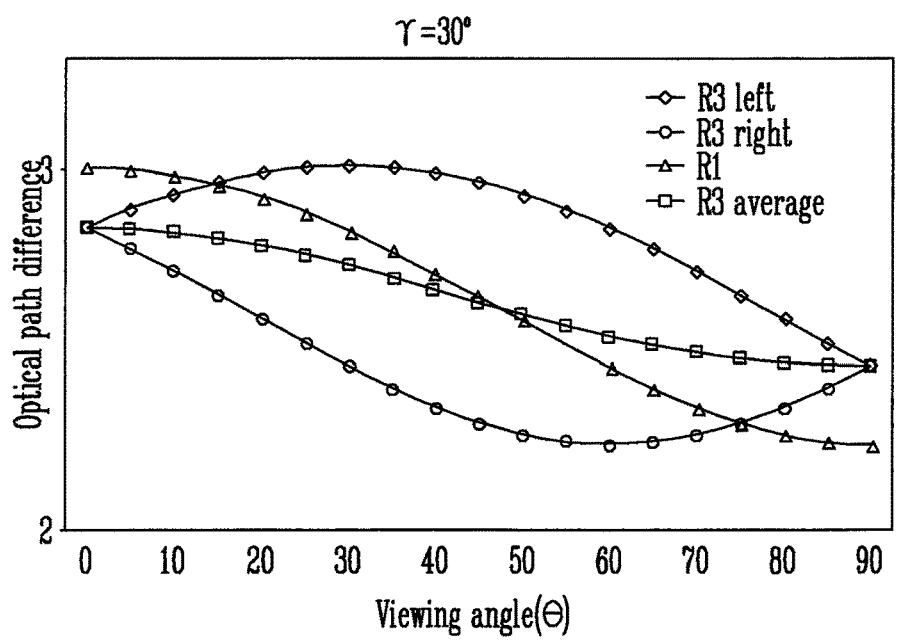
Figure 5:
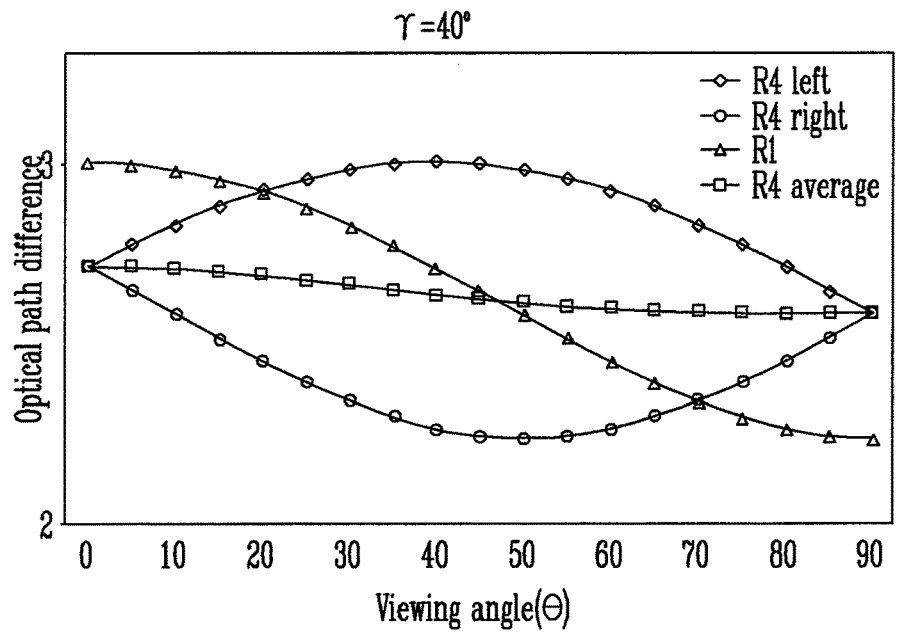
Figure 6:
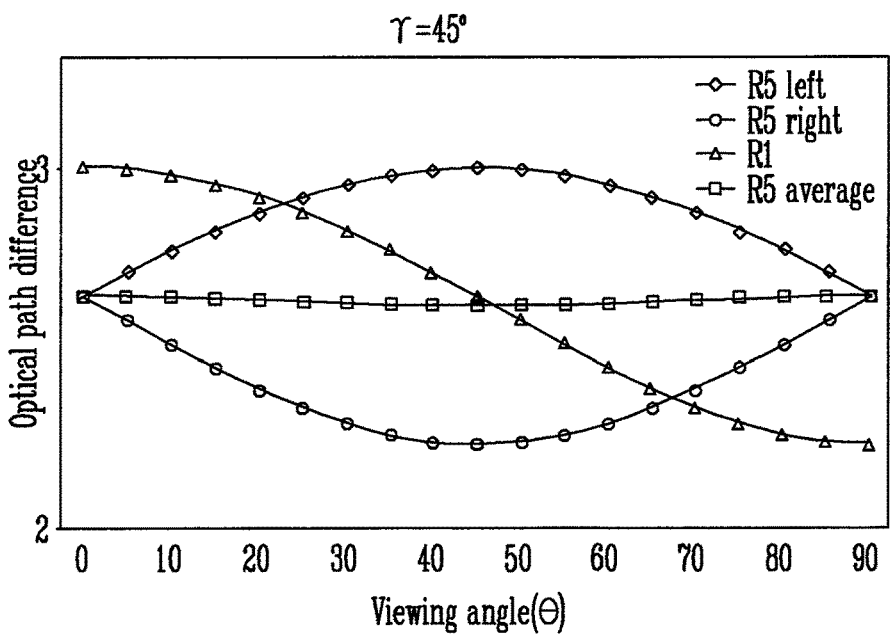

FIG. 1 is a conceptual circuit diagram illustrating an organic light emitting display device according to an embodiment of the present invention. FIG. 2 is a sectional view illustrating a pixel shown in FIG. 1.

Referring to FIGS. 1 and 2, the organic light emitting display device according to this embodiment may include a substrate DS having a display unit 10 for displaying an image, a scan drive 20, and a data drive 30.

Each of the scan drive 20 and the data drive 30 may be electrically coupled to (e.g., electrically connected to) the display unit 10 by being coupled to signal lines. Here, signal lines include scan lines SL1, SL2, . . . , SLn, data lines DL1, DL2, . . . , DLm, and power supply lines VL, and at least one signal line may cross or intersect the other signal lines.

For example, the scan drive 20 may be electrically coupled to (e.g., electrically connected to) the display unit 10 by the plurality of scan lines SL1, SL2, ..., SLn. The scan drive 20 may send a scan signal to the display unit 10 through the scan lines SL1, SL2, ..., SLn. The scan lines SL1, SL2, ..., SLn may extend in one direction on the substrate DS.

The data drive 30 may be electrically coupled to (e.g., electrically connected to) the data lines DL1, DL2, ..., DLm. Thus, the data drive 30 may be electrically coupled to (e.g., electrically connected to) the display unit 10 by the plurality of data lines DL1, DL2, ..., DLm. The data drive 30 may send a data signal to the display unit 10 through the data lines DL1, DL2, ..., DLm.

The data lines DL1, DL2, ..., DLm may extend in a direction different from that of the scan lines SL1, SL2, ..., SLn to cross or intersect the scan lines SL1, SL2, ..., SLn. The data lines DL1, DL2, ..., DLm and the scan lines SL1, SL2, ..., SLn may intersect or cross each other.

The power supply lines VL may apply power (that is, may electrically couple or connect a power source) to the display unit 10. The power supply lines VL may intersect or cross the data lines DL1, DL2, ..., DLm and the scan lines SL1, SL2, ..., SLn.

The display unit 10 may include a plurality of pixels PX. Each pixel PX may be electrically coupled to (e.g., electrically connected to) a corresponding data line among the data lines DL1, DL2, ..., DLm, a corresponding scan line among the scan lines SL1, SL2, ..., SLn, and a corresponding power supply line VL among the power supply lines VL.

Each pixel PX may include an organic light emitting diode OLED disposed on the substrate DS. The organic light emitting diode OLED may include a first electrode E1 disposed on the substrate DS, an organic layer OL disposed on the first electrode E1, and a second electrode E2 disposed on the organic layer OL.

At least one of the first and/or second electrodes E1 and E2 may allow light to be transmitted therethrough. For example, in a case where the organic light emitting display device is a rear-side emission display device, the first electrode E1 may be a transmissive electrode and the second electrode E2 may be a reflective electrode. In a case where the organic light emitting display device is a front-side emission display device, the first electrode E1 may be a reflective electrode and the second electrode E2 may be a transmissive electrode. In a case where the organic light emitting display device is a both-side emission display device, both the first and second electrodes E1 and E2 may be transmissive electrodes. Either the first or second electrode E1 or E2 may be an anode electrode, and the other of the first and second electrodes E1 and E2 may be a cathode electrode. Meanwhile, in order to improve the light extraction efficiency of the organic light emitting diode OLED, a semi-transmissive reflective electrode may be used (utilized) as the transmissive electrode. Thus, light generated in the organic layer OL may resonate between the first and second electrode E1 and E2, and light having wavelengths satisfying reinforcement conditions may be extracted to an outside of the organic light emitting diode OLED.

In this embodiment, a case where the first electrode E1 is a reflective anode electrode and the second electrode E2 is a transmissive cathode electrode (e.g., a front-side emission organic light emitting diode OLED) is described as an example.

Each pixel PX may include at least two domains D1 and D2 which radiate (e.g., emit) light in directions different from each other. Hereinafter, it will be described as an example that each pixel PX includes a first domain D1 which radiates light in one direction and a second domain D2 which radiates light in another direction.

The first and second domains D1 and D2 may be disposed at sides opposite to each other, based on a boundary line (that is, the first and second domains D1 and D2 may be disposed adjacent to each other about the boundary line). The organic layer OL of the organic light emitting diode OLED may be inclined in different directions with respect to a flat surface of the substrate DS in each of the first and second domains D1 and D2. For example, the organic layer OL may have a "V" shape where the upper surfaces of the organic layer OL in the first and second domains D1 and D2 are opposite to each other and inclined downward towards the boundary line between the first and second domains D1 and D2. Here, the organic layer OL may have a substantially symmetric shape in the first and second domains D1 and D2, based on the boundary between the first and second domains D1 and D2. The inclination angle (γ) of the organic layer OL may be about 0 to about 90 degrees with respect to the flat surface of the substrate DS. The inclination angle of the organic layer OL may be about 0 to about 45 degrees with respect to the flat surface of the substrate DS.

Thus, light emitted by the pixel PX is radiated in different directions in each of the first and second domains D1 and D2. In the pixel PX, the direction in which light is radiated from an area corresponding to the first domain D1 and the direction in which light is radiated from an area corresponding to the second domain D2 may be symmetric to each other, based on the boundary between the first and second domains D1 and D2.

Also, it has been illustrated in this embodiment that the organic layer OL has a "V" shape, but the present invention is not limited thereto. For example, the organic layer OL may have a "Λ" shape where the upper surfaces of the organic layer OL in the first and second domains D1 and D2 are opposite to each other and inclined upward toward the boundary line between the first and second domains D1 and D2.

FIGS. 3 to 6 are graphs illustrating optical path differences with respect to viewing angles. R1 is an optical path difference of an organic light emitting display device in which each pixel has a single domain and light is radiated from a flat surface (that is, light is radiated in a direction normal to the surface of the substrate). R2 to R5 are optical path differences of organic light emitting display devices in which each pixel has a structure as shown in FIGS. 1 and 2, and the inclination angles of an organic layer are 15, 30, 40 and 45 degrees, respectively.

Referring to FIGS. 3 to 6, the optical path difference R1 of the organic light emitting display device (in which the pixel has a single domain and light is radiated from the flat surface) decreases as the viewing angle increases. Therefore, in a case where the viewing angle is relatively great, a viewer may view a discolored image.

This is because the light generated in the organic layer resonates between first and second electrodes of the organic light emitting display device, and the optical path difference Δ decreases as the viewing angle θ increases as shown in the following Equation 1.

$$\Delta = \frac{2dn}{\cos(\Phi)} - 2d \times \tan(\Phi) \times \sin(\theta) \qquad \text{Equation 1}$$

Here, d denotes a thickness of the organic layer, n denotes a refractive index of the organic layer, and φ denotes an oscillation angle of light radiated in the organic layer.

That is, when the viewing angle θ increases, the optical path difference decreases due to resonance. Here, the wavelength of light emitted from the display is proportionate to the optical path difference, and therefore, the viewer views light having a wavelength shorter than that of the initially generated light.

However, for the optical path differences R2, R3, R4, and R5 of the organic light emitting display devices in which each pixel has a structure as shown in FIGS. 1 and 2 and the inclination angles of an organic layer are 15, 30, 40 and 45 degrees, respectively, the viewer may be positioned at different left and right sides of the display and the average optical path difference has a relatively minor or small change depending on a change in viewing angle. That is, the viewer viewing the organic light emitting display device including pixels having the structure shown in FIGS. 1 and 2 may view an image having a relatively minor or small change in image quality depending on a change in viewing angle. This is because although the viewer's viewing angle increases, the inclination angle of the organic layer offsets or prevents a substantial change in optical path difference.

Figure 7:
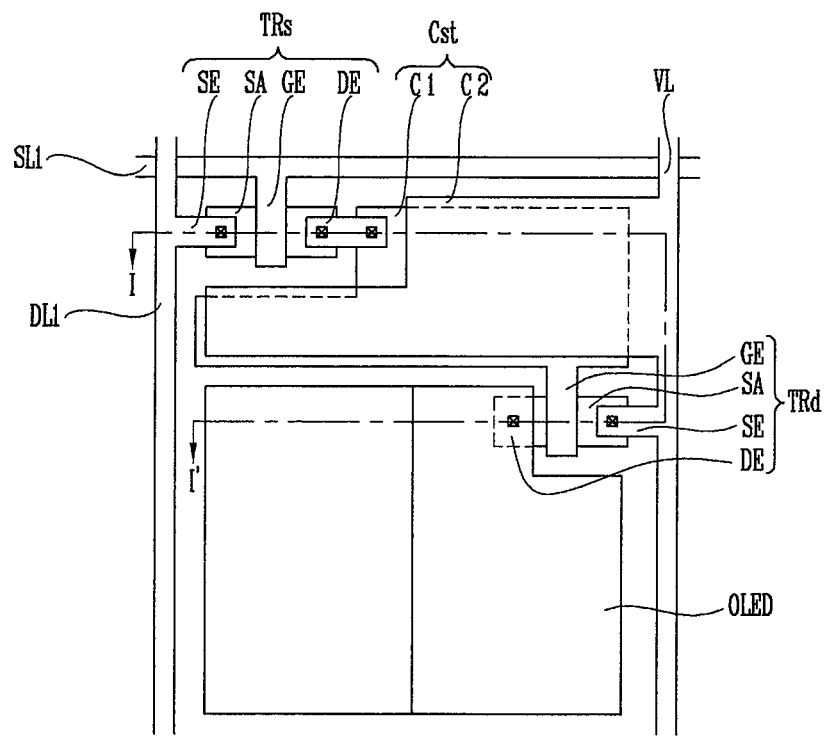
FIG. 7 is a plan view illustrating a pixel in an organic light emitting display device according to another embodiment of the present invention.
Figure 8:
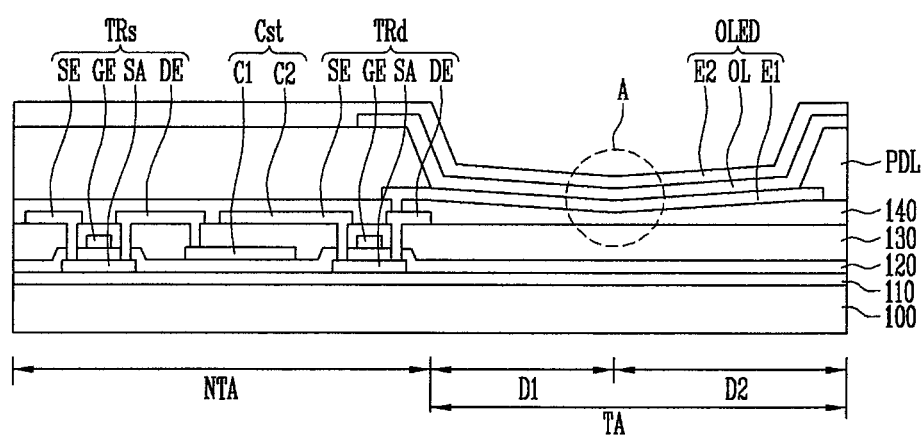
FIG. 8 is a sectional view taken along a line I-I' of FIG. 7.
Figure 9:
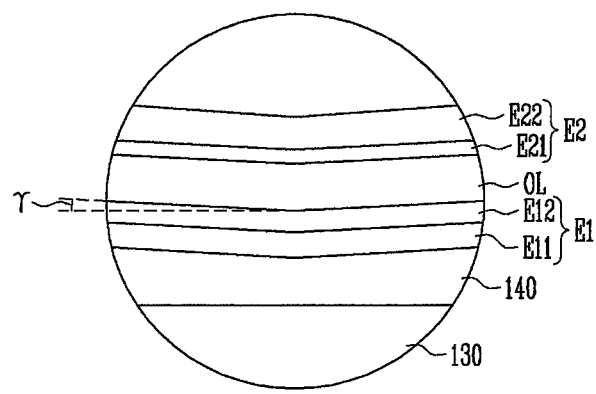
FIG. 9 is an enlarged view of area A of FIG. 8.

FIG. 7 is a plan view illustrating a pixel in an organic light emitting display device according to another embodiment of the present invention, FIG. 8 is a sectional view taken along a line I-I' of FIG. 7, and FIG. 9 is an enlarged view of area A of FIG. 8.

Referring to FIGS. 7 to 9, the pixel PX of the organic light emitting display device may be electrically coupled to (e.g., electrically connected to) a data line DL1, a scan line SL1, and a power supply line VL. The pixel PX may include a switching thin film transistor TRs, a driving thin film transistor TRd, a capacitor Cst electrically coupled to the switching thin film transistor TRs and the driving thin film transistor TRd, and an organic light emitting diode OLED. The pixel PX may be divided into a transmission area TA which allows light to be transmitted therethrough and a non-transmission area NTA which does not allow light to be transmitted therethrough (that is, blocks or prevents light from transmitting therethrough).

The switching thin film transistor TRs and the driving thin film transistor TRd are coupled to the scan line SL1 and the data line DL1. Each of the switching thin film transistor TRs and the driving thin film transistor TRd includes a semiconductor active layer SA, a gate electrode GE insulated from the semiconductor active layer SA, and source and drain electrodes SE and DE coupled to the semiconductor active layer SA.

For example, the switching thin film transistor TRs and the driving thin film transistor TRd may be disposed at the non-transmission area NTA of a base substrate 100. The base substrate 100 may be a rigid base substrate or a flexible base substrate. The rigid base substrate may be a glass base substrate, a quartz base substrate, a glass-ceramic base substrate, or a crystalline-glass base substrate. The flexible base substrate may be a film including a polymer organic material or a plastic base substrate. The material applied to the base substrate 100 should have resistance against a relatively high processing temperature (or have heat resistance) in a fabricating process.

Each of the switching thin film transistor TRs and the driving thin film transistor TRd includes the semiconductor active layer SA disposed on the base substrate 100, the gate electrode GE insulated from the semiconductor active layer SA, and source and drain electrodes SE and DE coupled to the semiconductor active layer SA.

The semiconductor active layer SA may include amorphous silicon (a-Si), multicrystalline silicon (p-Si), and/or an oxide semiconductor. The regions of the semiconductor active layer SA coupled to the source and drain electrodes SE and DE may be source and drain regions doped or injected with an impurity, and the region between the source and drain regions may be a channel region. Here, the oxide semiconductor may include zinc (Zn), indium (In), gallium (Ga), tin (Sn), and/or a mixture thereof. For example, the oxide semiconductor may include indium-gallium-zinc oxide (IGZO).

When the semiconductor active layer SA includes an oxide semiconductor, a light shielding layer for shielding light incident to the semiconductor active layer SA may be disposed on and beneath the semiconductor active layer SA.

A buffer layer 110 may be disposed between the semiconductor active layer SA and the base substrate 100. The buffer layer 110 may be a silicon oxide layer or a silicon nitride layer. The buffer layer 110 may be formed into a multi-layered structure including the silicon oxide layer and/or the silicon nitride layer. The buffer layer 110 prevents impurities from being diffused into the switching thin film transistor TRs, the driving thin film transistor TRd, and the organic light emitting diode OLED, and prevents moisture and oxygen from penetrating into the switching thin film transistor TRs, the driving thin film transistor TRd, and the organic light emitting diode OLED. The buffer layer 110 may planarize a surface of the base substrate 100.

A gate insulating layer 120 insulates the semiconductor active layer SA from the gate electrode GE by covering the semiconductor active layer SA and is disposed on the semiconductor active layer SA and the base substrate 100. The gate insulating layer 120 includes silicon oxide ($SiO_2$) and/or silicon nitride ($SiN_x$).

The scan line SL1 extends in one direction, and the scan line SL1 and a first capacitor electrode C1 are disposed on the gate insulating layer 120. A portion of the scan line SL1 may be the gate electrode GE of the switching transistor TRs and may extend into the pixel PX to overlap with the channel region of the semiconductor active layer SA.

An interlayer insulating layer 130 may be disposed on the gate insulating layer 120 and the gate electrode GE. Like the gate insulating layer 120, the interlayer insulating layer 130 may include silicon oxide and/or silicon nitride. The interlayer insulating layer 130 may expose portions of the source and drain regions of the semiconductor active layer SA therethrough (that is, the interlayer insulating layer 130 may have openings exposing portions of the source and drain regions).

The data line DL1 intersects or crosses the scan line SL1 while being insulated from the scan line SL1. The power supply line VL, the source electrode SE, and the drain electrode DE are disposed on the interlayer insulating layer 130. The source electrode SE, the drain electrode DE, a second capacitor electrode C2, the data line DL1, and the power supply line VL may include a material capable of reflecting light. For example, the source electrode SE, the drain electrode DE, the second capacitor electrode C2, the data line DL1, and the power supply line VL may include aluminum (Al) and/or an aluminum alloy (Al-alloy).

The source and drain electrodes SE and DE may be insulated from the gate electrode GE by the interlayer insulating layer 130. The source and drain electrodes SE and DE respectively contact the source and drain regions (that is, the source and drain regions of the semiconductor active layer SA).

Although it has been described in this embodiment that both the driving thin film transistor TRd and the switching thin film transistor TRs are thin film transistors having a top gate structure, the present invention is not limited thereto. For example, at least one of the driving thin film transistor TRd and the switching thin film transistor TRs may be a thin film transistor having a bottom gate structure.

The capacitor Cst includes the first capacitor electrode C1 and the second capacitor electrode C2. The first capacitor electrode C1 may be made of the same material and be at the same layer as the scan line SL1 and the gate electrode GE. That is, the first capacitor electrode C1 may be disposed on the gate insulating layer 120. The second capacitor electrode C2 may be made of the same material and be at the same layer as the data line DL1, the power supply line VL, the source electrode SE, and the drain electrode DE.

A protection layer 140 is disposed on the base substrate 100 including the switching thin film transistor TRs, the driving thin film transistor TRd, and the capacitor Cst. That is, the protection layer 140 may cover the switching thin film transistor TRs, the driving thin film transistor TRd, and the capacitor Cst. The protection layer 140 may have a contact opening CH (e.g., a contact hole) which exposes a portion of the drain electrode DE therethrough.

The protection layer 140 may include at least one layer. For example, the protection layer 140 may include an inorganic protection layer and an organic protection layer disposed on the inorganic protection layer. The inorganic protection layer may include silicon oxide and/or silicon nitride. The organic protection layer may include acryl, polyimide (PI), polyamide (PA), and/or benzocyclobutene (BCB). That is, the organic protection layer may be a planarization layer which is transparent and flexible to reduce stress in and planarize a lower structure.

The upper surface of the protection layer 140 may have a substantially flat surface at the non-transmission area NTA and have two inclination surfaces which are opposite to each other and inclined downward (e.g., downward towards each other) at the transmission area TA. That is, the upper surface of the protection layer 140 may have a "V" shape.

The organic light emitting diode OLED may be disposed on the protection layer 140 in the transmission area TA. The organic light emitting diode OLED may have (e.g., entirely have) a "V" shape due to the shape of the protection layer 140. That is, the transmission area TA may include two areas (e.g., first and second domains D1 and D2), and the organic light emitting diode OLED may be disposed at the domains D1 and D2. The organic light emitting diode OLED may include a first electrode E1 coupled to the drain electrode DE, an organic layer OL disposed on the first electrode, and a second electrode E2 disposed on the organic layer OL.

In this embodiment, the case where the first electrode E1 is a reflective, anode electrode and the second electrode E2 is a transmissive, cathode electrode will be described as an example.

The first electrode E1 may include a first conductive layer E11 disposed on the protection layer 140 and a second conductive layer E12 disposed on the first conductive layer E11. The first conductive layer E11 may be made of a material having excellent electrical conductivity and light reflectivity. For example, the first conductive layer E11 may include silver (Ag), aluminum (Al), platinum (Pt), nickel (Ni), and/or alloy thereof. The second conductive layer E12 may include a transparent, conductive oxide having a work function greater than that of the second electrode E2. For example, the second conductive layer E12 may include indium tin oxide (ITO), indium zinc oxide (IZO), aluminum zinc oxide (AZO), gallium-doped zinc oxide (GZO), zinc tin oxide (ZTO), gallium tin oxide (GTO) and/or fluorine-doped tin oxide (FTO). The first electrode E1 may have a shape corresponding to that of the protection layer 140. That is, the upper surface of the first electrode E1 may have a flat surface at the non-transmission area NTA and have two inclination surfaces which are opposite to each other and inclined downward at the transmission area TA.

The transmission area TA of the first electrode E1 may be exposed by a pixel defining layer PDL. The pixel defining layer PDL may include an organic insulation material. For example, the pixel defining layer PDL may include polystyrene, poly(methyl methacrylate) (PMMA), polyacrylonitrile (PAN), polyamide, polyimide, poly(aryl ether), a heterocyclic polymer, a poly(p-xylylene) polymer (e.g., Parylene), a fluoropolymer (a fluorine-series polymer), an epoxy resin, a benzocyclobutene (BCB) resin, a siloxane-series resin, and/or silane.

The organic layer OL is disposed on the first electrode E1 exposed by the pixel defining layer PDL. The organic layer OL includes at least an emitting layer (EML) and may generally have a multi-layered thin film structure. For example, the organic layer OL may include the emitting layer (EML) and/or at least one selected from a hole injection layer (HIL) for injecting a hole, a hole transport layer (HTL) having a superior transportation characteristic and for blocking migration of unbound electrons at the EML to increase a chance of hole-electron rebinding (the EML emitting light by rebinding the injected electrons to holes), a hole blocking layer (HBL) for suppressing migration of unbound holes at the EML, an electron transport layer (ETL) for smoothly transporting the electrons to the EML, and an electron injection layer (EIL) for injecting the electrons. The color of light generated in the EML may be red, green, blue, and/or white, but the present invention is not limited thereto. For example, the color of light generated in the EML may be magenta, cyan, and/or yellow.

The organic layer OL may have a shape corresponding to that of the first electrode E1. That is, the organic layer OL may have a "V" shape where the upper surfaces of the organic layer OL in the first and second domains D1 and D2 are opposite to each other and inclined downward toward a boundary between the first and second domains D1 and D2. Here, the organic layer OL may have a substantially symmetric shape in the first and second domains D1 and D2, based on the boundary between the first and second domains D1 and D2.

The inclination angle ($\gamma$) of the organic layer OL may be about 0 to about 90 degrees in the first and second domains D1 and D2. For example, the inclination angle of the organic layer OL may be about 0 to about 45 degrees in the first and second domains D1 and D2.

The second electrode E2 is disposed on the organic layer OL and may include a third conductive layer E21 configured to include a material having a work function less than that of the second conductive layer E12, and a fourth conductive layer E22 disposed on the third conductive layer E21. The third conductive layer E21 may include molybdenum (Mo), tungsten (W), silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), and/or an alloy thereof. The third conductive layer E21 may have a thickness such that light may be transmitted therethrough.

The fourth conductive layer E22 has conductivity to prevent a voltage drop (e.g., IR-drop) at the third conductive layer E21 and may include a material which enables light to be transmitted therethrough. For example, the fourth conductive layer E22 may include the same material as the second conductive layer E12.

The second electrode E2 may have a shape corresponding to that of the organic layer OL. That is, the upper surface of the second electrode E2 may have a flat surface at the non-transmission area NTA and have two inclination surfaces which are opposite to each other and inclined downward at the transmission area TA.

Therefore, in the organic light emitting display device, the directions in which light is radiated in (emitted from) the first and second domains D1 and D2 may be different from each other. Accordingly, a viewer viewing the organic light emitting display device may view an image having a relatively minor or small change in image quality depending on a change in viewing angle. This is because although the viewer's viewing angle increases, the inclination angle (γ) of the organic layer OL offsets a substantial increase in viewing angle.

Hereinafter, a method of fabricating the organic light emitting display device will be described with reference to FIGS. 10 to 12.

Figure 10:
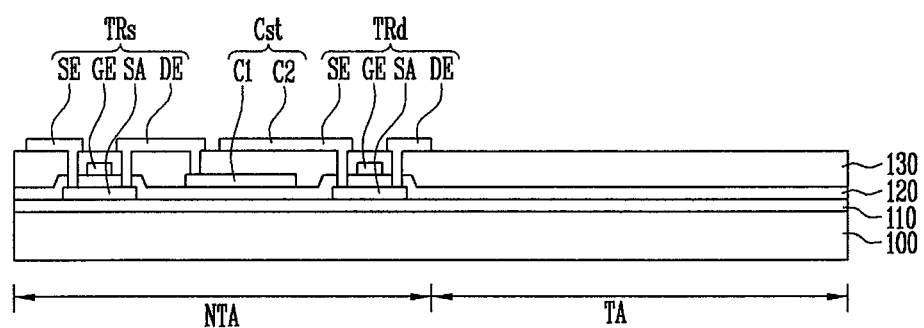
FIGS. 10 to 12 are process sectional views illustrating a method of fabricating the organic light emitting display device shown in FIGS. 7 to 9.
Figure 11:
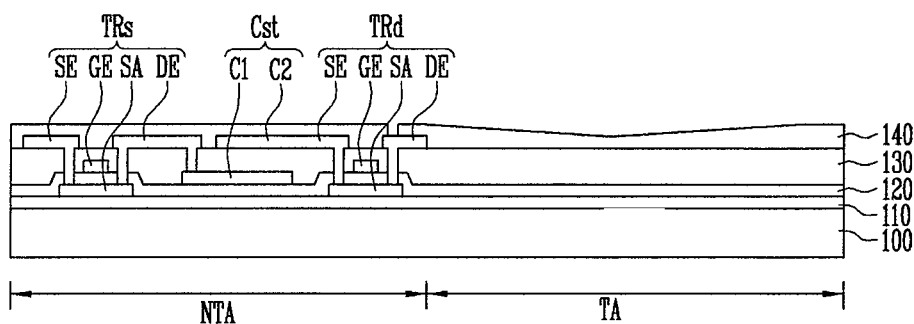
Figure 12:
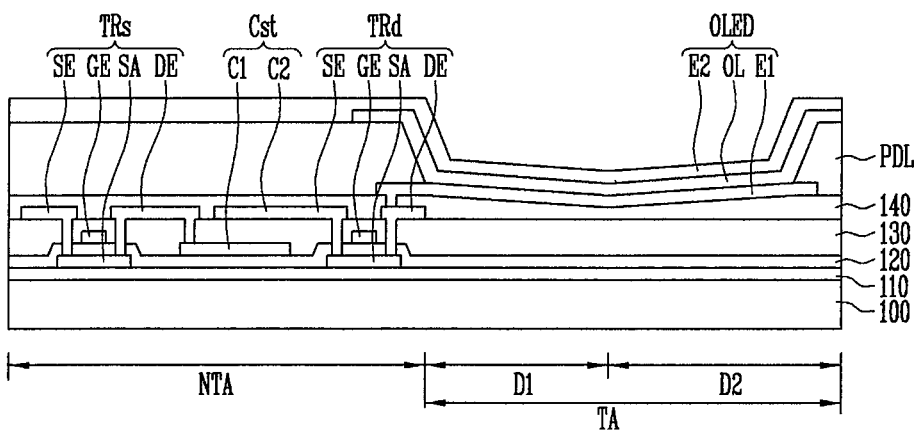

FIGS. 10 to 12 are process sectional views illustrating a method of fabricating the organic light emitting display device shown in FIGS. 7 to 9.

First, referring to FIG. 10, a base substrate 100 is prepared. The base substrate 100 may be divided into a transmission area TA which allows light to be transmitted therethrough and a non-transmission area NTA which does not allow light to be transmitted therethrough (e.g., blocks light).

The base substrate 100 may be a rigid base substrate or a flexible base substrate. The rigid base substrate may be a glass base substrate, a quartz base substrate, a glass-ceramic base substrate, or a crystalline-glass base substrate. The flexible base substrate may be a film base substrate including a polymer organic material or a plastic base substrate. The material applied to the base substrate 100 should have resistance against a relatively high processing temperature (or heat resistance) in a fabricating process.

Then, a buffer layer 110 is formed on the base substrate 100. The buffer layer 110 may be a silicon oxide layer or a silicon nitride layer. The buffer layer 110 may be formed into a multi-layered structure including the silicon oxide layer and/or the silicon nitride layer. The buffer layer 110 prevents the diffusion of impurities included in the base substrate 100. The buffer layer 110 also prevents moisture and oxygen from penetrating from an outside thereof. The buffer layer 110 may planarize a surface of the base substrate 100.

After the buffer layer 110 is formed, a switching thin film transistor TRs, a capacitor C, and a driving thin film transistor TRd are formed on the buffer layer 110 at the non-transmission area NTA.

Hereinafter, the formation of the switching thin film transistor TRs, the capacitor C, and the driving thin film transistor TRd will be described in more detail.

First, a semiconductor active layer SA is formed on the buffer layer 110. The semiconductor active layer SA may include amorphous silicon (a-Si), multicrystalline silicon (p-Si), and/or an oxide semiconductor. In a case where the semiconductor active layer SA includes the multicrystalline silicon (p-Si), the semiconductor active layer SA may be formed by depositing amorphous silicon (a-Si) on the buffer layer 110 and then crystallizing and patterning the amorphous silicon.

After the semiconductor active layer SA is formed, a gate insulating layer 120 is formed on the semiconductor active layer SA and the buffer layer 110. The gate insulating layer 120 may include silicon oxide and/or silicon nitride.

After the gate insulating layer 120 is formed, a gate electrode GE, a scan line SL, and a first capacitor electrode C1 are formed on the gate insulating layer 120. The gate electrode GE may be overlapped with the semiconductor active layer SA. Here, the region of the semiconductor active layer SA overlapped with the gate electrode GE may be a channel region, and the regions at respective sides of the channel region may be source and drain regions.

After the gate electrode GE, the scan line SL, and the first capacitor electrode C1 are formed, an interlayer insulating layer 130 is formed. The interlayer insulating layer 130 may include silicon oxide and/or silicon nitride.

After the interlayer insulating layer 130 is formed, the source and drain regions are exposed by patterning the interlayer insulating layer 130, and a portion of the first capacitor electrode C1 is exposed.

Then, a source electrode SE coupled to the source region, a drain electrode DE coupled to the drain region, a second capacitor electrode C2 insulated from the first capacitor electrode C1, a data line DL, and a power supply line VL are formed, thereby forming the switching thin film transistor TRs, the capacitor C, and the driving thin film transistor TRd.

That is, each of the switching thin film transistor TRs and the driving thin film transistor TRd includes the semiconductor active layer SA, the gate electrode GE, the source electrode SE, and the drain electrode DE, respectively. The capacitor C includes the first capacitor electrode C1 and the second capacitor electrode C2. Here, the drain electrode DE of the switching thin film transistor TRs may be coupled to the first capacitor electrode C1.

The source electrode SE, the drain electrode DE, a second capacitor electrode C2, the data line DL1, and the power supply line VL may include a material capable of reflecting light. For example, the source electrode SE, the drain electrode DE, the second capacitor electrode C2, the data line DL1, and the power supply line VL may include aluminum (Al) and/or an aluminum alloy (Al-alloy).

Referring to FIG. 11, a protection layer 140 is formed on the base substrate 100 including the switching thin film transistor TRs, the capacitor C, and the driving thin film transistor TRd. The protection layer 140 may include at least one layer. For example, the protective layer 140 may include an inorganic protection layer and an organic protection layer disposed on the inorganic protection layer. The inorganic protection layer may include silicon oxide and/or silicon nitride. The organic protection layer may include acryl, polyimide (PI), polyamide (PA), and/or benzocyclobutene (BCB). That is, the organic protection layer may be a planarization layer which is transparent and flexible, to reduce stress in and planarize a lower structure.

After the protection layer 140 is formed, the protection layer 140 is patterned. A portion of the drain electrode DE of the driving thin film transistor TRd is exposed by the patterning. The protection layer 140 may have a "V" shape at the transmission area TA where the upper surfaces of the protection layer 140 are opposite to each other and inclined downward.

Referring to FIG. 12, after the protection layer 140 is patterned, an organic light emitting diode OLED is formed.

The organic light emitting diode OLED includes a first electrode E1 disposed on the protection layer 140 at the transmission area TA, an organic layer OL disposed on the first electrode E1, and a second electrode E2 disposed on the organic layer OL. Here, the organic light emitting diode OLED may have a "V" shape corresponding to the shape of the protection layer 140. That is, the transmission area TA may include two areas (e.g., a first domain D1 and a second domain D2), and the organic light emitting diode OLED may be disposed at the domains D1 and D2.

For example, the first electrode E1 is formed on the protection layer 140. The first electrode E1 may include a first conductive layer E11 disposed on the protection layer 140, and a second conductive layer E12 disposed on the first conductive layer E11. The first conductive layer E11 may be made of a material having excellent electrical conductivity and light reflectivity. For example, the first conductive layer E11 may include at least one of silver (Ag), aluminum (Al), platinum (Pt), nickel (Ni), and/or an alloy thereof. The second conductive layer E12 may include a transparent, conductive oxide having a work function greater than that of the second electrode E2. For example, the second conductive layer E12 may include indium tin oxide (ITO), indium zinc oxide (IZO), aluminum zinc oxide (AZO), gallium-doped zinc oxide (GZO), zinc tin oxide (ZTO), gallium tin oxide (GTO), and/or fluorine-doped tin oxide (FTO). The first electrode E1 may have a shape corresponding to that of the protection layer 140. That is, the upper surface of the first electrode E1 may have a flat surface at the non-transmission area NTA and have two inclination surfaces which are opposite to each other and inclined downward at the transmission area TA (e.g., inclined downwards towards the center of the transmission area TA).

After the first electrode E1 is formed, a pixel defining layer PDL exposing a portion of the first electrode E1 (e.g., the first electrode E1 disposed in the transmission area TA) is formed. The pixel defining layer PDL may include an organic insulation material. For example, the pixel defining layer PDL may include polystyrene, poly(methyl methacrylate) (PMMA), polyacrylonitrile (PAN), polyamide, polyimide, poly(aryl ether), a heterocyclic polymer, a polypxylylene) polymer (e.g., Parylene), a fluoropolymer (a fluorine-series polymer), an epoxy resin, a benzocyclobutene (BCB) resin, a siloxane-series resin and/or silane.

After the pixel defining layer PDL is formed, the organic layer OL is formed on the first electrode E1. The organic layer OL includes at least an emitting layer (EML) and may generally have a multi-layered thin film structure. For example, the organic layer OL may include the emitting layer (EML) and/or at least one selected from a hole injection layer (HIL) for injecting a hole, a hole transport layer (HTL) having a superior transportation characteristic and for blocking migration of unbound electrons at the EML to increase a chance of hole-electron rebinding (the EML emitting light by rebinding the injected electrons to holes), a hole blocking layer (HBL) for suppressing migration of unbound holes at the EML, an electron transport layer (ETL) for smoothly transporting the electrons to the EML, and an electron injection layer (EIL) for injecting the electrons.

The organic layer OL may have a shape corresponding to that of the first electrode E1. That is, the organic layer OL may have a "V" shape where the upper surfaces of the organic layer OL at the first and second domains D1 and D2 are opposite to each other and inclined downward. Here, the organic layer OL may have a substantially symmetric shape in the first and second domains D1 and D2, based on the boundary between the first and second domains D1 and D2.

The inclination angle of the organic layer OL may be about 0 to about 90 degrees in the first and second domains D1 and D2. For example, the inclination angle of the organic layer OL may be about 0 to about 45 degrees in the first and second domains D1 and D2.

After the organic layer OL is formed, the second electrode E2 is formed on the organic layer OL. The second electrode E2 includes a third conductive layer E21 configured to include a material having a work function less than that of the second conductive layer E12 and a fourth conductive layer E22 disposed on the third conductive layer E21. The third conductive layer E21 may include Mo, W, Ag, Mg, Al, Pt, Pd, Au, Ni, Nd, Ir, Cr, Li, Ca, and/or an alloy thereof. The third conductive layer E21 may have a thickness such that light may be transmitted through the third conductive layer E21. The fourth conductive layer E22 has conductivity to prevent a voltage drop (e.g., IR-drop) at the third conductive layer E21 and may include a material which allows light to be transmitted therethrough.

The second electrode E2 may have a shape corresponding to that of the organic layer OL. That is, the upper surface of the second electrode E2 may have a flat surface at the non-transmission area NTA and have two inclination surfaces which are opposite to each other and inclined downward at the transmission area TA.

Hereinafter, other embodiments of the present invention will be described with reference to FIGS. 13 to 17. In FIGS. 13 to 17, components identical or substantially similar to those shown in FIGS. 1 to 12 are designated by like reference numerals, and their detailed descriptions may be omitted. In FIGS. 13 to 17, components and aspects different from those shown in FIGS. 1 to 12 will be primarily described to avoid redundancy.

Figure 13:
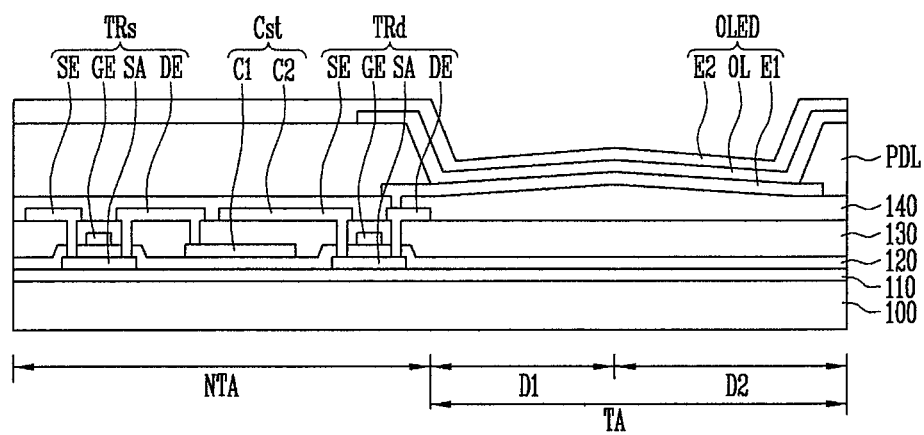
FIG. 13 is a sectional view illustrating an organic light emitting display device according to still another embodiment of the present invention.

FIG. 13 is a sectional view illustrating an organic light emitting display device according to still another embodiment of the present invention.

Referring to FIG. 13, the organic light emitting display device may be divided into a transmission area TA and a non-transmission area NTA. The organic light emitting display device includes a switching thin film transistor TRs, a capacitor Cst, a driving thin film transistor TRd, and an organic light emitting diode OLED.

The switching thin film transistor TRs, the capacitor Cst, and the driving thin film transistor TRd are disposed at the non-transmission area NTA on a base substrate 100. The switching thin film transistor TRs, the capacitor Cst, and the driving thin film transistor TRd are covered by an upper protection layer 140.

The upper surface of the protection layer 140 may have a flat surface at the non-transmission area NTA. The upper surface of the protection layer 140 may have two inclination surfaces which are opposite to each other and inclined upward at the transmission area TA. That is, at the transmission area TA, the upper surface of the protection layer 140 may have a "A" shape.

The organic light emitting diode OLED may be disposed on the protection layer 140. The organic light emitting diode OLED may include a first electrode E1 coupled to the driving thin film transistor TRd, an organic layer OL disposed on the first electrode E1, and a second electrode E2 disposed on the organic layer OL. The organic light emitting diode OLED may have (e.g., entirely have) a "A" shape corresponding to the shape of the protection layer 140. That is, the transmission area TA may include two areas (e.g., first and second domains D1 and D2), and the organic light emitting diode OLED may be disposed in the domains D1 and D2. At the first and second domains D1 and D2, the inclination angle of the organic layer OL may be about 0 to about 90 degrees. For example, the inclination angle of the organic layer OL may be about 0 to about 45 degrees.

Figure 14:
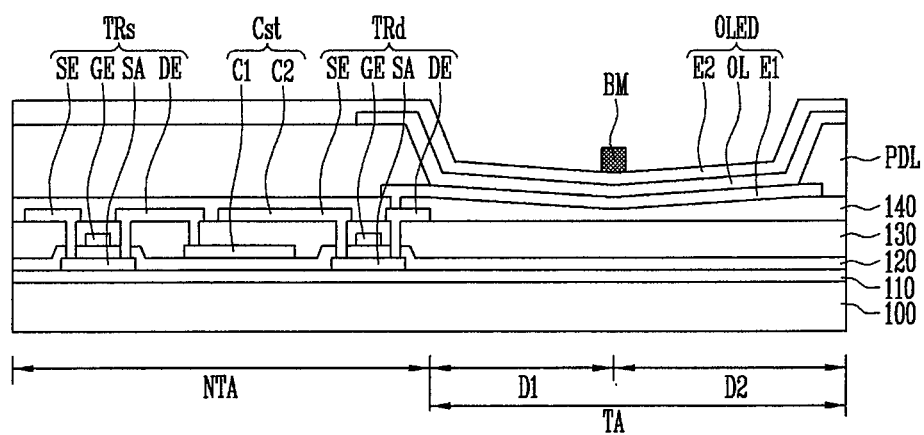
FIGS. 14 to 17 are sectional views illustrating organic light emitting display devices according to still other embodiments of the present invention.

FIG. 14 is a sectional view illustrating an organic light emitting display device according to still another embodiment of the present invention.

Referring to FIG. 14, the organic light emitting display device may be divided into a transmission area TA and a non-transmission area NTA. The organic light emitting display device includes a switching thin film transistor TRs, a capacitor Cst, a driving thin film transistor TRd, and an organic light emitting diode OLED.

The switching thin film transistor TRs, the capacitor Cst, and the driving thin film transistor TRd are disposed at the non-transmission area NTA on a base substrate 100. The switching thin film transistor TRs, the capacitor Cst, and the driving thin film transistor TRd are covered by an upper protection layer 140.

The upper surface of the protection layer 140 may have a flat surface at the non-transmission area NTA. The upper surface of the protection layer 140 may have two inclination surfaces which are opposite to each other and inclined downward at the transmission area TA (e.g., inclined downward toward the center of the transmission area TA). That is, at the transmission area TA, the upper surface of the protection layer 140 may have a "V" shape.

The organic light emitting diode OLED may be disposed on the protection layer 140. The organic light emitting diode OLED may include a first electrode E1 coupled to the driving thin film transistor TRd, an organic layer OL disposed on the first electrode E1, and a second electrode E2 disposed on the organic layer OL. The organic light emitting diode OLED may have (e.g., may entirely have) a "V" shape corresponding to the shape of the protection layer 140. That is, first and second domains D1 and D2 may be at the transmission area TA, and the organic light emitting diode OLED may be disposed at the domains D1 and D2. At the first and second domains D1 and D2, the inclination angle of the organic layer OL may be about 0 to about 90 degrees. For example, the inclination angle of the organic layer OL may be about 0 to about 45 degrees.

At the boundary between the first and second domains D1 and D2, a light shielding pattern BM may be disposed on the second electrode E1. The light shielding pattern BM may include (e.g., may be) metal, silicon, and/or carbon black. The light shielding pattern BM may prevent the interference of light generated in the organic layer OL of the first and second domains D1 and D2 (that is, the light shielding pattern BM may prevent the interference between light generated in the first and second domains D1 and D2).

Figure 15:
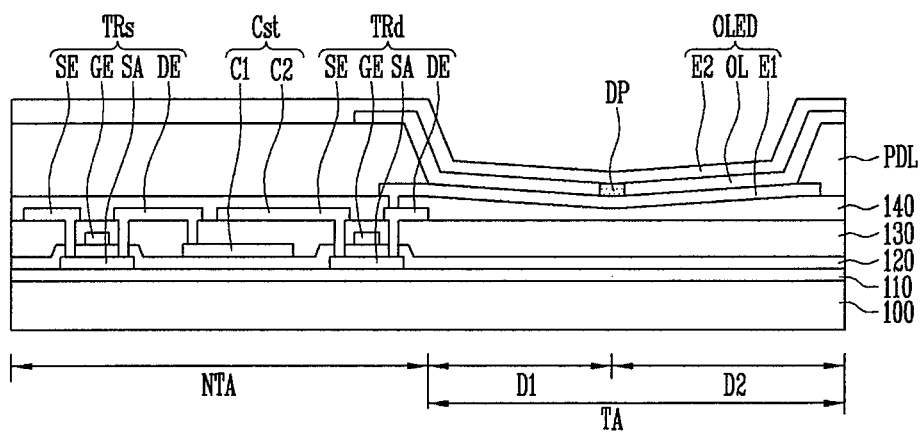

FIG. 15 is a sectional view illustrating an organic light emitting display device according to still another embodiment of the present invention.

Referring to FIG. 15, the organic light emitting display device may be divided into a transmission area TA and a non-transmission area NTA. The organic light emitting display device includes a switching thin film transistor TRs, a capacitor Cst, a driving thin film transistor TRd, and an organic light emitting diode OLED.

The switching thin film transistor TRs, the capacitor Cst, and the driving thin film transistor TRd are disposed at the non-transmission area NTA on a base substrate 100. The switching thin film transistor TRs, the capacitor Cst, and the driving thin film transistor TRd are covered by an upper protection layer 140.

The upper surface of the protection layer 140 may have a flat surface at the non-transmission area NTA. The upper surface of the protection layer 140 may have two inclination surfaces which are opposite to each other and inclined downward at the transmission area TA. That is, at the transmission area TA, the upper surface of the protection layer 140 may have a "V" shape.

The organic light emitting diode OLED may be disposed on the protection layer 140. The organic light emitting diode OLED may include a first electrode E1 coupled to the driving thin film transistor TRd, an organic layer OL disposed on the first electrode E1, and a second electrode E2 disposed on the organic layer OL. The organic light emitting diode OLED may have (e.g., may entirely have) a "V" shape corresponding to the shape of the protection layer 140. That is, the transmission area TA may include first and second domains D1 and D2, and the organic light emitting diode OLED may be disposed at the domains D1 and D2. At the first and second domains D1 and D2, the inclination angle of the organic layer OL may be about 0 to about 90 degrees. For example, the inclination angle of the organic layer OL may be about 0 to about 45 degrees.

The organic layers OL disposed at the first and second domains D1 and D2 may be spaced from (e.g., spaced apart from) each other. An insulating pattern DP may be disposed between the organic layers disposed at the first and second domains D1 and D2 (e.g., the insulating pattern DP may be disposed at a boundary between the first and second domains D1 and D2 and/or at the same layer of the OLED as the organic layers OL). For example, the insulating pattern DP may include the same material as the pixel defining layer PDL.

Thus, it is possible to reduce or prevent the interference of light generated in the organic layer OL of the first and second domains D1 and D2 (that is, it is possible to reduce or prevent light generated in one of the first and second domains D1 and D2 from interfering with light generated in the other of the first and second domains D1 and D2).

Figure 16:
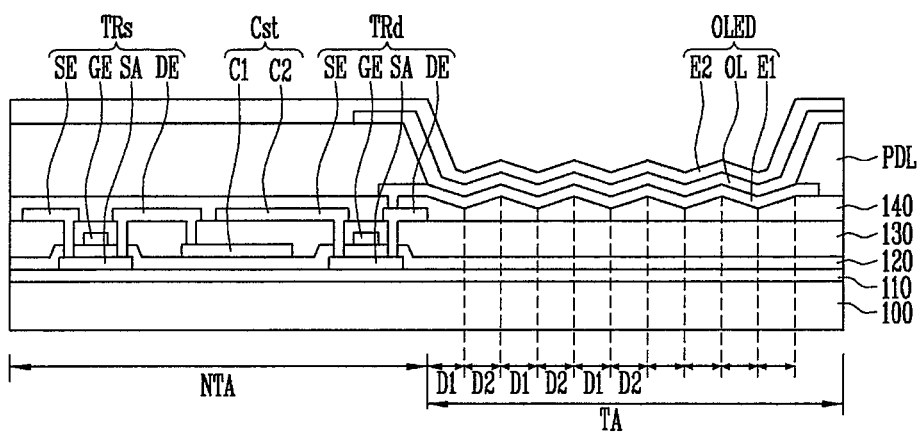

FIG. 16 is a sectional view illustrating an organic light emitting display device according to still another embodiment of the present invention.

Referring to FIG. 16, the organic light emitting display device may be divided into a transmission area TA and a non-transmission area NTA. The organic light emitting display device includes a switching thin film transistor TRs, a capacitor Cst, a driving thin film transistor TRd, and an organic light emitting diode OLED.

The switching thin film transistor TRs, the capacitor Cst, and the driving thin film transistor TRd are disposed at the non-transmission area NTA on a base substrate 100. The switching thin film transistor TRs, the capacitor Cst, and the driving thin film transistor TRd are covered by an upper protection layer 140.

The upper surface of the protection layer 140 may have a flat surface at the non-transmission area NTA. The upper surface of the protection layer 140 at the transmission area TA may have a plurality of uneven patterns each having two inclination surfaces which are opposite to each other and inclined downward. That is, at the transmission area TA, the upper surface of the protection layer 140 may have a plurality of uneven patterns each having a "V" shape.

The organic light emitting diode OLED may be disposed on the protection layer 140. The organic light emitting diode OLED may include a first electrode E1 coupled to the driving thin film transistor TRd, an organic layer OL disposed on the first electrode E1, and a second electrode E2 disposed on the organic layer OL. The transmission area TA may include first domains D1 and second domains D2, and the organic light emitting diode OLED may be disposed at the domains D1 and D2. For example, the first and second domains D1 and D2 may be alternately disposed.

Thus, in adjacent first and second domains D1 and D2, the organic layer OL may have an uneven pattern having a "V" shape where the upper surfaces of the organic layer OL are opposite to each other and inclined downward. At the first and second domains D1 and D2, the inclination angle of the organic layer OL may be about 0 to about 90 degrees. For example, the inclination angle of the organic layer OL may be about 0 to about 45 degrees.

Figure 17:
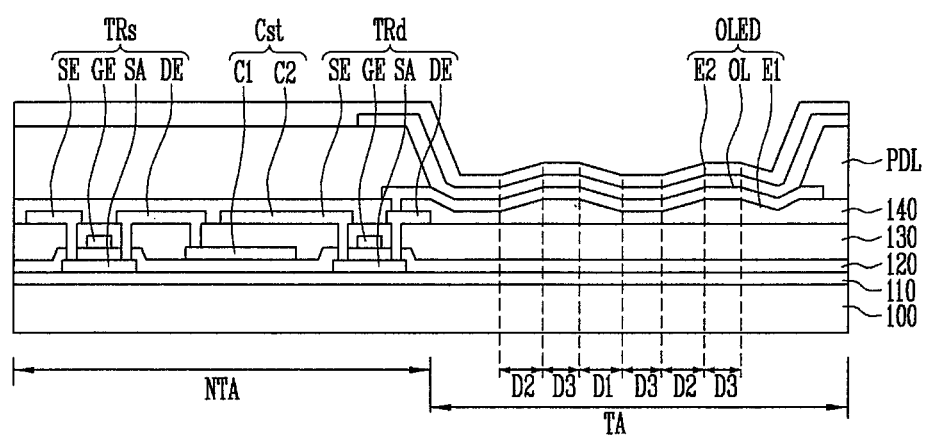

FIG. 17 is a sectional view illustrating an organic light emitting display device according to still another embodiment of the present invention.

Referring to FIG. 17, the organic light emitting display device may be divided into a transmission area TA and a non-transmission area NTA. The organic light emitting display device includes a switching thin film transistor TRs, a capacitor Cst, a driving thin film transistor TRd, and an organic light emitting diode OLED.

The switching thin film transistor TRs, the capacitor Cst, and the driving thin film transistor TRd are disposed at the non-transmission area NTA on a base substrate 100. The switching thin film transistor TRs, the capacitor Cst, and the driving thin film transistor TRd are covered by an upper protection layer 140.

The upper surface of the protection layer 140 may have a flat surface at the non-transmission area NTA. The upper surface of the protection layer 140 may have a plurality of uneven patterns at the transmission area TA. Each uneven pattern may include two inclination surfaces that are inclined downward and a flat surface between (e.g., connecting) the inclination surfaces.

The organic light emitting diode OLED may be disposed on the protection layer 140. The organic light emitting diode OLED may include a first electrode E1 coupled to the driving thin film transistor TRd, an organic layer OL disposed on the first electrode E1, and a second electrode E2 disposed on the organic layer OL. The transmission area TA may include first domains D1 and second domains D2, alternately disposed (or arranged), and third domains D3 between the first and second domains D1 and D2. The organic light emitting diode OLED may be disposed at the domains D1, D2, and D3.

At the first and second domains D1 and D2, the inclination angle of the organic layer OL may be about 0 to about 90 degrees. For example, the inclination angle of the organic layer OL may be about 0 to about 45 degrees. In the third domains D3, the inclination angle of the organic layer OL may be 0 degree (that is, the organic layer OL may be flat at the third domains D3).

By way of summation and review, the organic light emitting display device has a configuration in which each pixel has a plurality of domains, and the directions in which the respective domains radiate light are different from each other, so that it is possible to improve display characteristics, such as white angle dependency (WAD), according to a viewer's viewing angle. Accordingly, the organic light emitting display device may have improved side visibility.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims and their equivalents.

What is claimed is:

1. An organic light emitting display device comprising:
    a substrate;
    a scan line;
    an interlayer insulating layer on the scan line;
    a data line on the interlayer insulating layer, the data line crossing the scan line;
    a power supply line crossing the scan line and the data line; and
    a pixel on the substrate and electrically coupled to the scan line, the data line, and the power supply line, the pixel being divided into a transmission area and a non-transmission area,
    wherein the pixel comprises:
        a thin-film transistor on the non-transmission area;
        a protection layer over the thin-film transistor and at the transmission area and the non-transmission area, an upper surface of the protection layer having a flat surface at the non-transmission area;
        a pixel defining layer on the protection layer, the pixel defining layer having an opening therein; and
        an organic light emitting diode, the organic light emitting diode comprising a first electrode on the protection layer, an organic layer on the first electrode and in the opening of the pixel defining layer, and a second electrode on the organic layer,
    wherein the pixel further comprises at least two domains in the opening of the pixel defining layer and radiates light in one of a direction toward the substrate and a direction away from the substrate,
    wherein the domains in the pixel radiate light in directions different from each other, and the directions in which the domains radiate light are inclined to the substrate, and
    wherein the upper surface of the protection layer in the opening of the pixel defining layer comprises two inclination surfaces which are not separated and are continuously declined toward a center of the opening of the pixel defining layer with respect to an upper surface of the interlayer insulating layer at the transmission area.

2. The organic light emitting display device of claim 1, wherein the at least two domains of the pixel comprise:
    a first domain configured to radiate light in a first direction; and
    a second domain configured to radiate light in a second direction different from the first direction.

3. The organic light emitting display device of claim 2, wherein upper surfaces of the organic layer at the respective first and second domains are opposite to each other and inclined downward.

4. The organic light emitting display device of claim 3, wherein an inclination angle is in a range of about 0 to about 45 degrees.

5. The organic light emitting display device of claim 1, wherein the at least two domains share the first electrode, the organic layer, and the second electrode.

6. The organic light emitting display device of claim 5, wherein the organic layer is inclined in different directions with respect to a flat surface of the substrate in the domains.

7. The organic light emitting display device of claim 2, wherein the first and second directions are symmetric to each other about a boundary between the first and second domains.

\* \* \* \* \*